United States Patent [19]
Havel

[11] Patent Number: 5,057,768
[45] Date of Patent: Oct. 15, 1991

[54] MEASURING DEVICE WITH VARIABLE COLOR DISPLAY

[76] Inventor: Karel Havel, 15 Kensington Road, Apt. 190 704, Bramalea, ON, Canada, L6T 3W2

[21] Appl. No.: 528,229

[22] Filed: May 24, 1990

Related U.S. Application Data

[60] Division of Ser. No. 337,410, Apr. 13, 1989, which is a division of Ser. No. 940,100, Dec. 10, 1986, Pat. No. 4,831,326, which is a continuation-in-part of Ser. No. 882,430, Jul. 7, 1986, Pat. No. 4,734,619.

[51] Int. Cl.[5] .................... G01R 15/08; G01F 23/24
[52] U.S. Cl. .................................. 324/115; 324/96; 340/701
[58] Field of Search ............... 324/115, 120, 96, 99 D; 340/701, 703, 762

[56] References Cited

U.S. PATENT DOCUMENTS

| | | | |
|---|---|---|---|
| 2,643,344 | 6/1953 | McLaren et al. | 324/115 |
| 2,682,000 | 6/1954 | Clayton et al. | 324/115 |
| 2,889,518 | 6/1959 | Hudson et al. | 324/99 D |
| 3,740,570 | 6/1973 | Kaelin et al. | 340/703 |
| 3,840,873 | 10/1974 | Usui | 340/703 |
| 4,360,804 | 11/1982 | Ohura | 340/703 |
| 4,438,498 | 3/1984 | Sekel et al. | 364/483 |
| 4,484,187 | 11/1984 | Brown et al. | 340/703 |

FOREIGN PATENT DOCUMENTS

| | | |
|---|---|---|
| 1257334 | 7/1989 | Canada . |
| 1257335 | 7/1989 | Canada . |

*Primary Examiner*—Ernest F. Karlsen

[57] ABSTRACT

A measuring device includes a variable color display for indicating measured values of an input signal. A comparator and a color control circuit are provided for controlling the color of the display in accordance with the relation of the measured value of the signal to predetermined limits.

15 Claims, 6 Drawing Sheets

MEASURING DEVICE WITH VARIABLE COLOR DISPLAY

CROSS-REFERENCE TO RELATED APPLICATIONS

This is a division of my copending application Ser. No. 07/337,410, filed on Apr. 13, 1989, entitled Digital Voltmeter with Variable Color Background, which is a division of my application Ser. No. 06/940,100, filed on Dec. 10, 1986, entitled Digital Voltmeter with Variable Color Background, now U.S. Pat. No. 4,831,326 issued on May 16, 1989, which is a continuation-in-part of my application Ser. No. 06/882,430, filed on July 7, 1986, entitled Display Device with Variable Color Background, now U.S. Pat. No. 4,734,619 issued on Mar. 29, 1988. This also relates to my application Ser. No. 06/819,111, filed on Jan. 15, 1986, entitled Variable Color Digital Multimeter, now U.S. Pat. No. 4,794,383 issued on Dec. 27, 1988, to my application Ser. No. 06/946,036, filed on Dec. 24, 1986, entitled Variable Color Analog Voltmeter, now U.S. Pat. No. 4,812,744 issued on Mar. 14, 1989, and to my application Ser. No. 07/155,311, filed on Feb. 12, 1988, entitled Display Telephone with Transducer, now U.S. Pat. No. 4,845,745 issued on July 4, 1989.

BACKGROUND OF THE INVENTION

1. Field of the Invention

This invention relates to measuring devices utilizing a variable color display.

2. Description of the Prior Art

Commercially available measuring instruments with monochromatic digital readout are capable of performing measurements and displaying results at a relatively fast rate. However, to determine a significance of each measured value, an operator must rapidly read displayed values and perform mental comparisons with predetermined limits. The task is much more complicated when the limits are variable.

A system for measuring radioactivity described in U.S. Pat. No. 2,643,344, issued on June 23, 1953 to Ian H. McLaren et al., includes an indicator with three scales and three associated light bulbs of respectively different colors. Each of the light bulbs illuminates the indicator face with a distinctive color to indicate which measurement scale is applicable.

A digital meter described in U.S. Pat. No. 2,889,518, issued on June 2, 1959 to Harold R. Hudson et al., includes a rotation counter mechanically driven by a motor which also rotates a potentiometer. The motor continues to rotate until the voltage at the wiper of the potentiometer is equal to the unknown voltage. The numerical count on the counter is then a direct measure of the unknown voltage. To indicate measurement range, lamps are placed between the different rotatable sections of the mechanical counter to indicate by lighting the decimal point for the counter reading.

A driving circuit for light emitting diodes, described in U.S. Pat. No. 3,740,570 issued on June 19, 1973 to George R. Kaelin et al., utilizes special light emitting diodes that emit light of different colors in response to different currents.

SUMMARY OF THE INVENTION

Accordingly, it is the principal object of this invention to provide an improved measuring device for facilitating prompt recognition of a significance of the measured value.

It is another object of the invention to provide an improved measuring device utilizing a variable color display.

It is still another object of the invention to provide a measuring device employing a variable color display with integral variable color background area.

It is still another object of the invention to provide a measuring device in which the color of the display may be controlled in accordance with the relation of the measured values to predetermined limits.

In summary, a measuring device of the invention is provided with a variable color display for indicating the measured value of an input signal in a character format. The measuring device also includes a comparator for comparing the measured value with a predetermined low limit and a predetermined high limit, to determine whether the measured value lies below the low limit, or above the high limit, or within the bounds of the limits, and for developing comparison signals accordingly. Color control circuits are provided for controlling the color of the display in accordance with the comparison signals.

Further objects of the invention will become obvious from the accompanying drawings and their description.

BRIEF DESCRIPTION OF THE DRAWINGS

In the drawings in which are shown the preferred embodiments of the invention.

Throughout the drawings, like characters indicate like parts.

DESCRIPTION OF THE PREFERRED EMBODIMENTS

Figure 1:
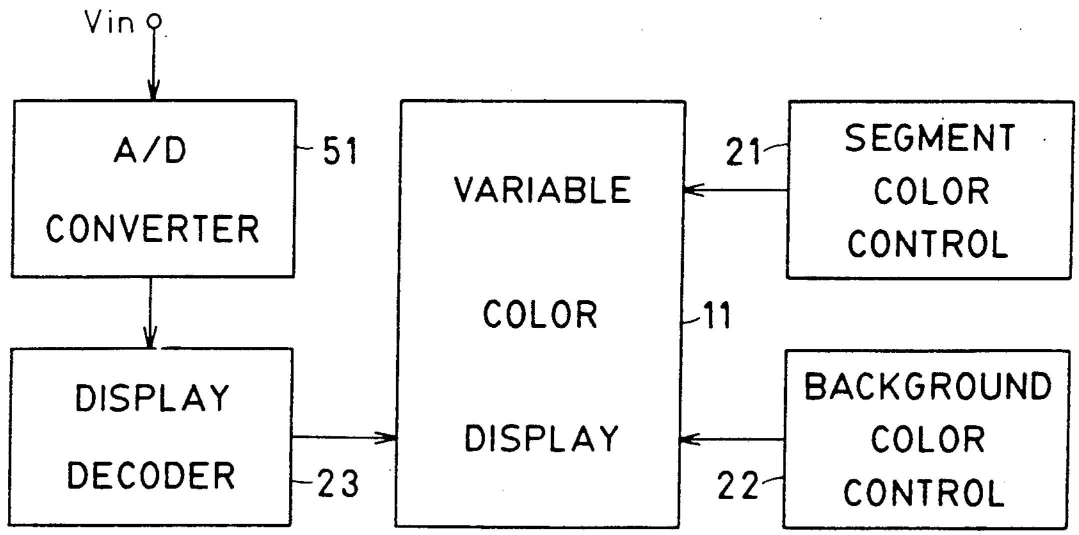
FIG. 1 is a block diagram of a digital voltmeter with a variable color display.

Referring now, more particularly, to the drawings, in FIG. 1 is shown a block diagram of a digital voltmeter utilizing a variable color display surrounded by a variable color background area. The digital voltmeter includes an A/D (analog to digital) converter 51, for converting an analog signal Vin applied to its input to digital data, and a display decoder 23 for causing the digital data to be displayed in a character format on a variable color display 11, in a manner well known to those skilled in the art. As will be more specifically pointed out subsequently, the display 11 includes variable color display areas arranged in a pattern and surrounded by an integral variable color background area. The invention resides in the addition of a segment color control 21 and a background color control 22 for illuminating display 11 in a color related to the measured value. The digital voltmeter of this invention can thus simultaneously indicate the measured value, in a character format, and its significance, in a color of the display. By way of an example, measured value that is considered to be normal may be indicated in green color, measured value that is slightly abnormal may be indicated in blue color, and measured value that is critical may be indicated in red color.

Figure 2:
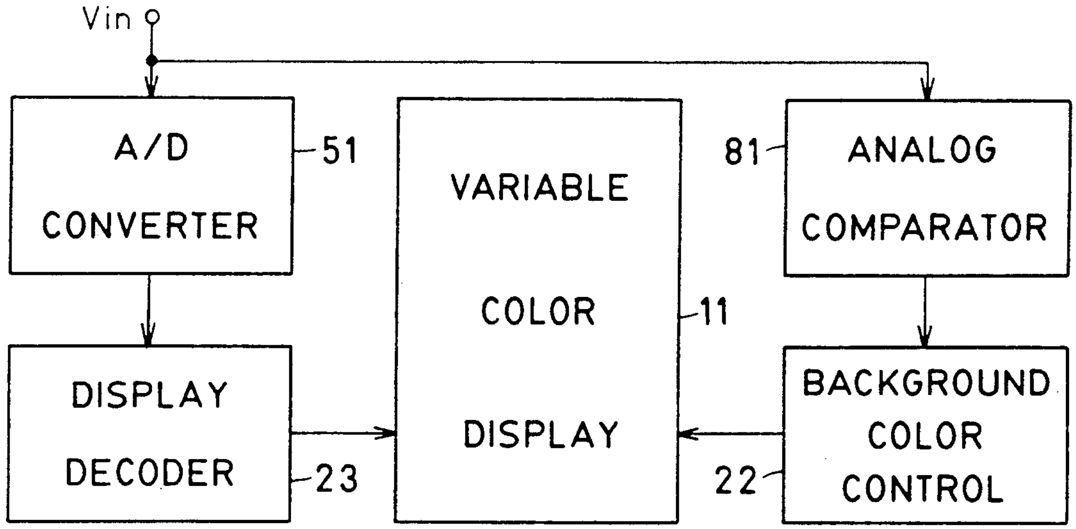
FIG. 2 is a block diagram of a variable color digital voltmeter with an analog comparator.

In FIG. 2 is shown a block diagram of a like digital voltmeter characterized by an analog comparator 81. The input of analog comparator 81 is coupled to the input of A/D converter 51 for comparing an input signal with predetermined limits and for developing comparison signals accordingly. The background color control 22 illuminates the background area of display 11 in accordance with the comparison signals.

Figure 3:
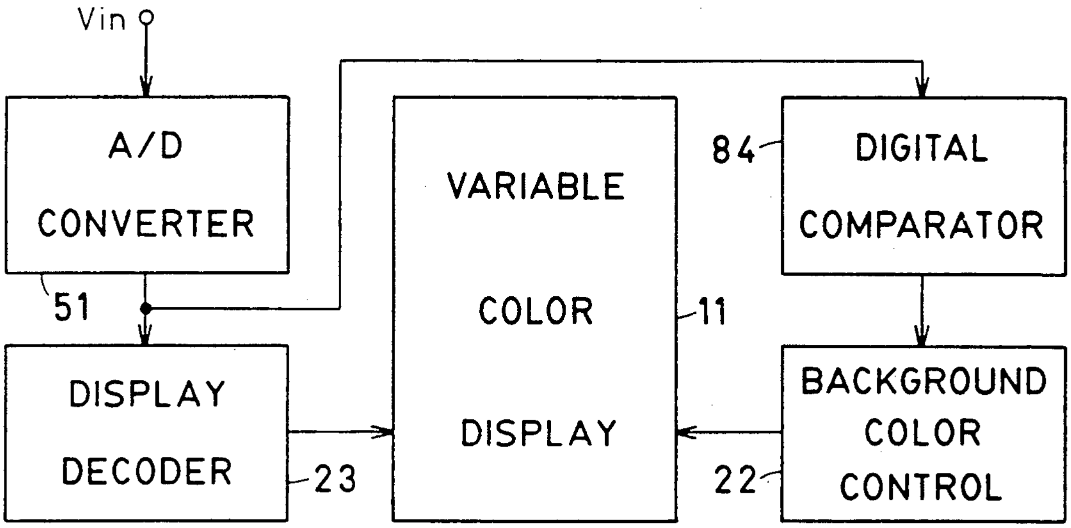
FIG. 3 is a block diagram of a variable color digital voltmeter with a digital comparator.

In FIG. 3 is shown a block diagram of a like digital voltmeter characterized by a digital comparator 84. The input of digital comparator 84 is coupled to the output of A/D converter 51 for comparing the output digital data with predetermined limits and for developing comparison signals accordingly. The background color control 22 illuminates the background area of display 11 in accordance with the comparison signals.

Figure 4:
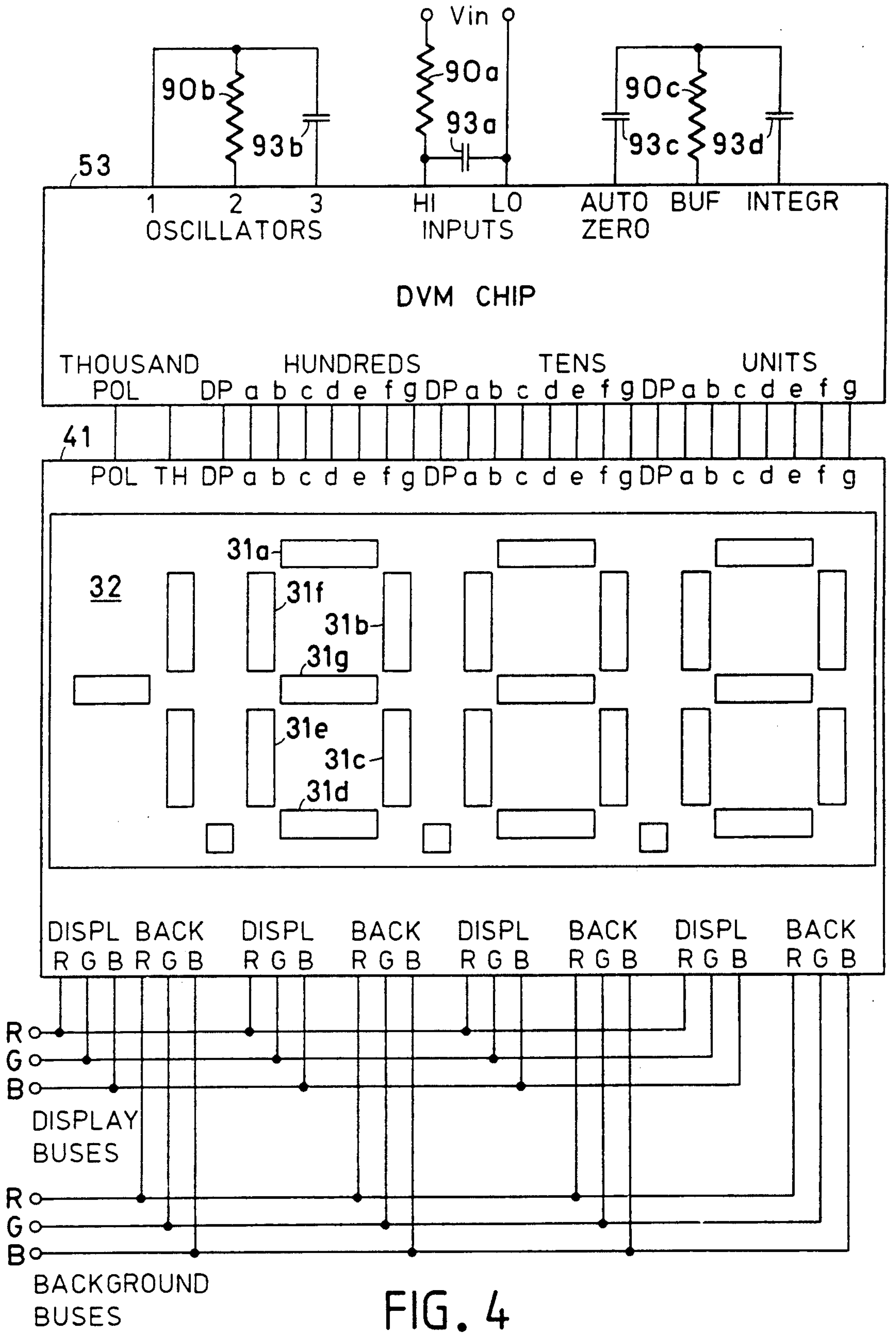
FIG. 4 is a simplified schematic diagram of a digital voltmeter of the invention.

In FIG. 4 is shown a schematic diagram of a digital voltmeter of this invention which includes a DVM (digital voltmeter) chip 53 for measuring input signal Vin applied, via a resistor 90*a* and decoupling capacitor 93*a*, to its HI (high) and LO (low) inputs, and for developing segment drive signals a, b, c, d, e, f, g, and DP (decimal point) for a 3 ½ digit variable color display 41 on which measured values of the input signal may be indicated in a character format. Resistor 90*b* and capacitor 93*b*, coupled to input OSCILLATORS, are provided for selecting a suitable frequency of internal oscillators. An auto zero capacitor 93*c* tends to decrease noise. Integrating capacitor 93*d* and buffer resistor 90*c* provide desired voltage swing and linearity.

The first display element of the display 41 consists of a figure '1' and a minus sign. The second, third, and fourth display elements consist of seven segments arranged in a well known 7-segment font on which selected characters may be exhibited in variable color. In the second display element, the segments are designated as 31*a*, 31*b*, 31*c*, 31*d*, 31*e*, 31*f*, and 31*g*. Each display element has three color control inputs R (red), G (green), and B (blue) designated DISPL. Each display element is surrounded by a variable color background area, as will be more clearly pointed out subsequently. The background area of each display element also has three color control inputs R, G, and B designated as BACK. It is obvious from the illustration that the color control inputs of the display elements and background areas are respectively interconnected to form DISPLAY BUSES R, G, and B, for uniformly controlling color of all display elements, and BACKGROUND BUSES R, G, and B, for uniformly controlling color of the entire background area 32.

Figure 5:
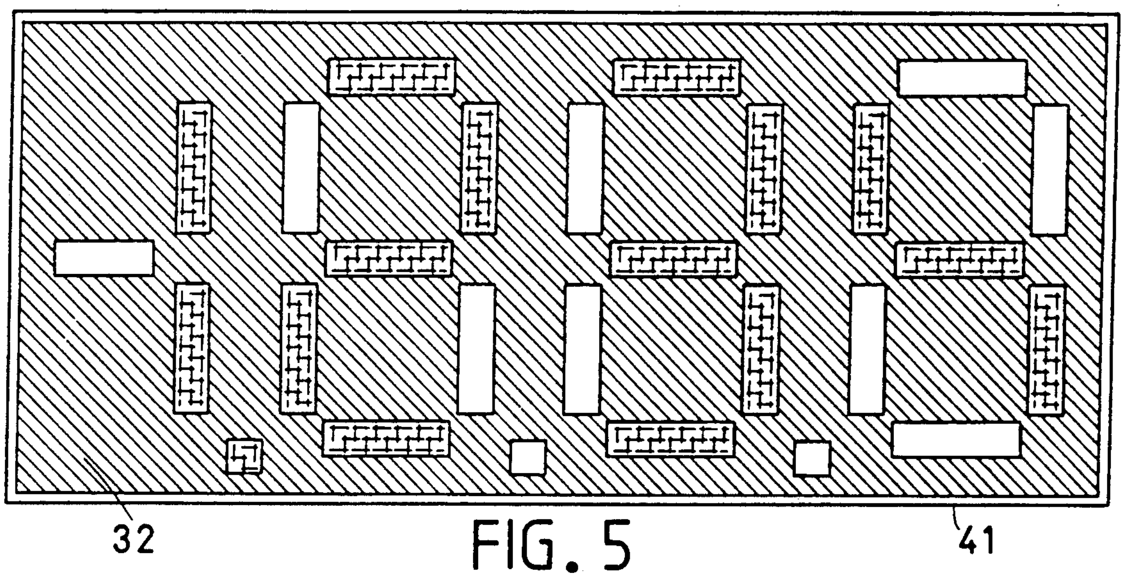
FIG. 5 is an exemplary detail of the display on which measured result is displayed in yellow color on green background.
Figure 6:
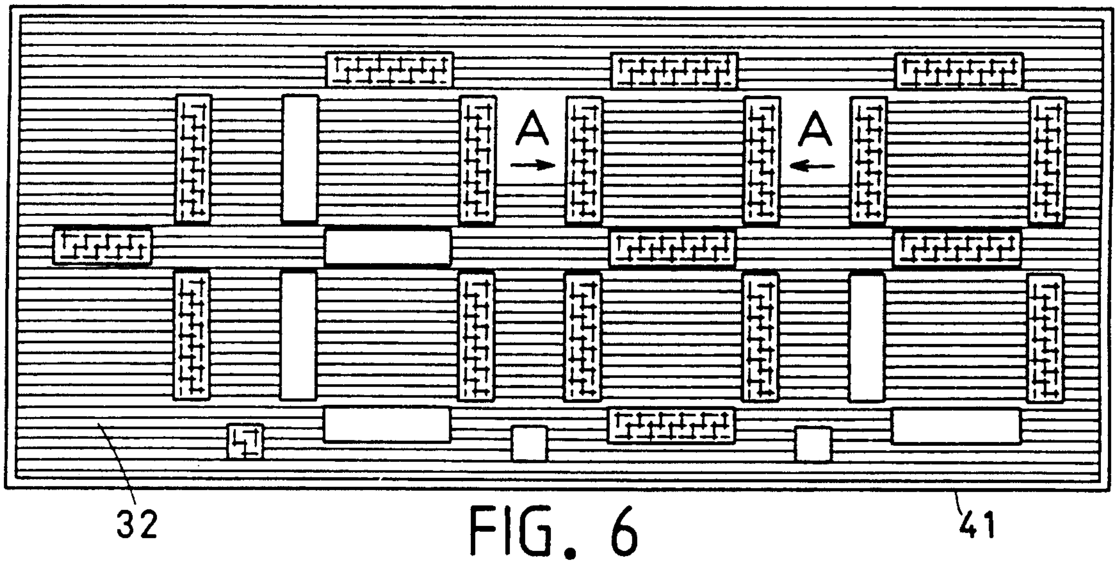
FIG. 6 is a similar detail of the display on which measured result is displayed in yellow color on blue background.
Figure 7:
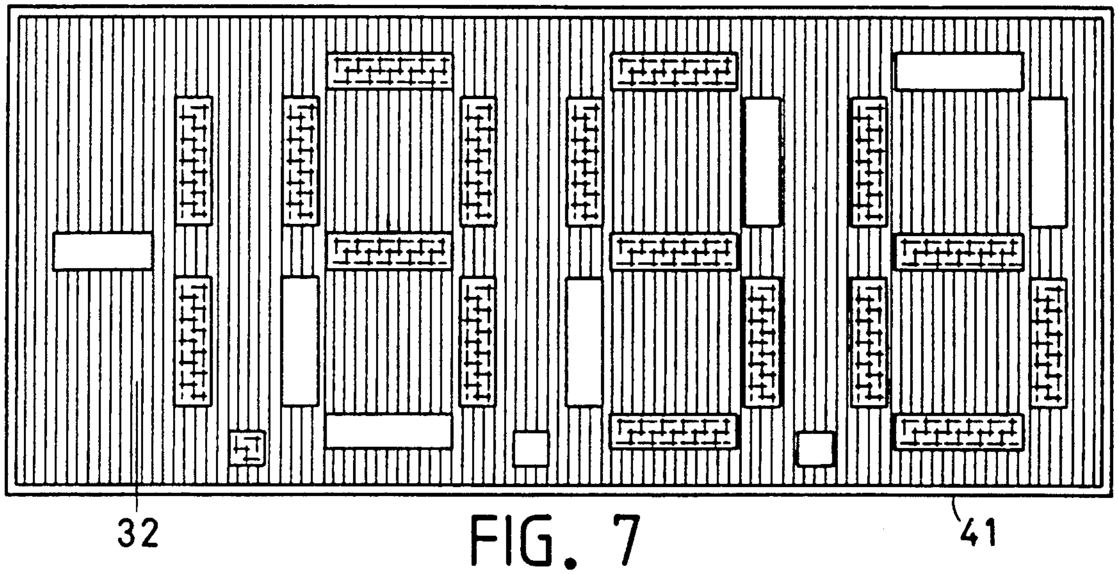
FIG. 7 is a similar detail of the display on which measured result is displayed in yellow color on red background.

FIGS. 5 to 7 are examples of displayed measured values which consider exemplary low limit −1.5 and high limit 1.5 (in Volts or in any other suitable units). The invention resides in controlling the color of background area 32 to indicate whether the measured value lies within the bounds of the low and high limits, below the low limit, or above the high limit. FIG. 5 shows display 41 on which a measured value 1.234 is displayed on green background, to indicate that it lies within the bounds of the low and high limits. FIG. 6 shows display 41 on which a measured value −1.789 is displayed on blue background, to indicate that it lies below the low limit. FIG. 7 shows display 41 on which a measured value 1.956 is displayed on red background, to indicate that it lies above the high limit. To render the illustration less complex, all measured values are displayed in yellow color. It will be appreciated that the color of the display areas may be also varied, to enhance the presentation, as will be pointed out subsequently.

It is readily apparent that the method of displaying measured values shown in FIGS. 5 to 7 is extremely advantageous. Being completely surrounded by background area 32, all display elements in display 41 are effectively associated therewith. It is perfectly clear that the color of background area 32 relates to the values exhibited on the display elements within its boundaries, and not to values exhibited on display elements which may be located outside the boundaries.

Figure 8:
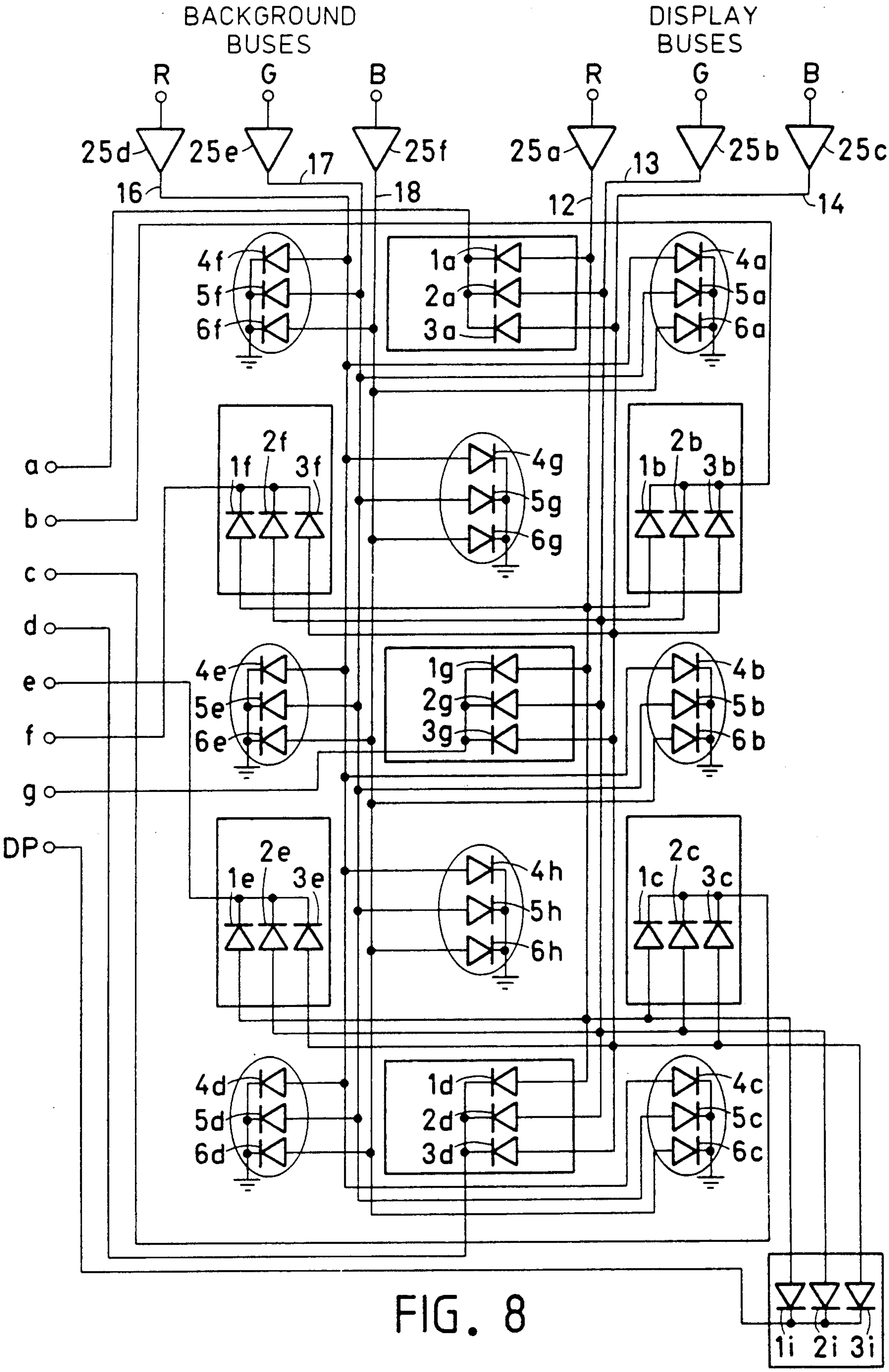
FIG. 8 is a simplified schematic diagram of one element of a variable color display device.

Proceeding now to the detailed description, in FIG. 8 is shown a simplified schematic diagram of a one-character 7-segment variable color display element with variable color background. Each display segment of the display element includes a triad of closely adjacent LEDs: a red LED 1, green LED 2, and blue LED 3 which are adapted for producing a composite light signal of a variable color. To facilitate the illustration, the LEDs are designated by segment letters, e. g., red LED in the segment b is shown at 1*b*, green LED in the segment d is shown at 2*d*, and blue LED in the segment f is shown at 3*f*. The background area is comprised of background regions adjacent the display segments. Each background region includes a triad of closely adjacent LEDs: a red LED 4, green LED 5, and blue LED 6 which are adapted for producing a composite light signal of a variable color. As much as possible, the LEDs in the background regions are designated by letters of adjacent display segments.

The cathodes of all red, green, and blue display LED triads are interconnected in each display segment and electrically connected to respective inputs a, b, c, d, e, f, g, and DP (decimal point) which may be coupled to the outputs of DVM chip 53 viewed in FIG. 4. The anodes of all display red LEDs 1*a*, 1*b*, 1*c*, 1*d*, 1*e*, 1*f*, 1*g*, and 1*i* are commonly coupled to an electric path referred to as a display red bus 12. The anodes of all display green LEDs 2*a*, 2*b*, 2*c*, 2*d*, 2*e*, 2*f*, 2*g*, and 2*i* are commonly coupled to a like electric path referred to as a display green bus 13. The anodes of all display blue LEDs 3*a*, 3*b*, 3*c*, 3*d*, 3*e*, 3*f*, 3*g*, and 3*i* are commonly coupled to a like electric path referred to as a display blue bus 14.

In a similar fashion, the anodes of all background red LEDs 4*a*, 4*b*, 4*c*, 4*d*, 4*e*, 4*f*, 4*g*, and 4*h* are commonly coupled to an electric path referred to as a background red bus 16. The anodes of all background green LEDs 5*a*, 5*b*, 5*c*, 5*d*, 5*e*, 5*f*, 5*g*, and 5*h* are commonly coupled to a like electric path referred to as a background green bus 17. The anodes of all background blue LEDs 6*a*, 6*b*, 6*c*, 6*d*, 6*e*, 6*f*, 6*g*, and 6*h* are commonly coupled to a like electric path referred to as a background blue bus 18. The cathodes of all red, green, and blue LED triads in each background region are grounded.

The display red bus 12 is connected to the output of a non-inverting buffer 25*a* capable of sourcing sufficient current to illuminate all display red LEDs. The display green bus 13 is connected to the output of a like buffer 25*b*. The display blue bus 14 is connected to the output of a like buffer 25*c*. The background red bus 16 is connected to the output of a like buffer 25*d*. The background green bus 17 is connected to the output of a like buffer 25*e*. The background blue bus 18 is connected to the output of a like buffer 25*f*. It would be obvious to those skilled in the art that current limiting resistors may be connected in series with all LEDs in the circuit to constrain current flow. The operation of the display element shown in FIG. 4 will be now explained by the example of illuminating digit '1' in yellow color. To exhibit decimal number '1', low voltage levels are applied to the inputs b and c, to illuminate equally designated segments, and high voltage levels are applied to all remaining inputs a, d, e, f, g, and DP, to extinguish all remaining segments.

To illuminate the display element in yellow color, the color control inputs R and G of the display buses are raised to a high logic level, while color control input B is maintained at a low logic level. As a result, the outputs of buffers 25*a* and 25*b* rise to a high logic level. The current flows from the output of buffer 25*a*, via display red bus 12 and red LED 1*b*, to the input b, and, via red LED 1*c*, to the input c. The current also flows from the output of buffer 25*b*, via display green bus 13 and green LED 2*b*, to the input b, and, via green LED 2*c*, to the input c. As a result of blending light signals of red and green colors in the segments b and c, the segments illuminate in substantially yellow color, creating a visual impression of a character '1'.

To illuminate the background area in green color, the color control input G of the background buses is raised to a high logic level, while the remaining color control inputs R and B are low. As a result, the output of buffer 25*e* rises to a high logic level. The current flows therefrom, via background green bus 17 and green LEDs 5*a*, 5*b*, 5*c*, 5*d*, 5*e*, 5*f*, 5*g*, and 5*h* in all background regions, to ground. The entire background area illuminates in green color.

Figure 9:
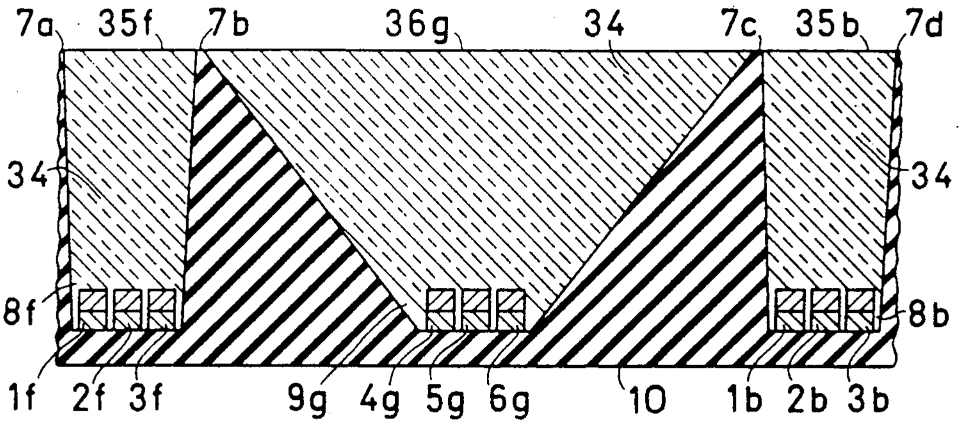
FIG. 9 is a cross-sectional view, taken along the line A—A in FIG. 6, revealing internal structure of a portion of a variable color display device.

To illuminate the background area in blue color, the color control input B of the background buses is raised to a high logic level, while the remaining color control inputs R and G are low. As a result, the output of buffer 25*f* rises to a high logic level. The current flows therefrom, via background blue bus 18 and blue LEDs 6*a*, 6*b*, 6*c*, 6*d*, 6*e*, 6*f*, 6*g*, and 6*h* in all background regions, to ground. The entire background area illuminates in blue color. To illuminate the background area in red color, the color control input R of the background buses is raised to a high logic level, while the remaining color control inputs G and B are low. As a result, the output of buffer 25*d* rises to a high logic level. The current flows therefrom, via background red bus 16 and red LEDs 4*a*, 4*b*, 4*c*, 4*d*, 4*e*, 4*f*, 4*g*, and 4*h* in all background regions, to ground. The entire background area illuminates in red color. An important consideration has been given to physical arrangement of the LEDs in the display areas and background regions, as illustrated in FIG. 9. Display red LED 1*f*, green LED 2*f*, and blue LED 3*f* are disposed on a support 10 in a display light blending cavity 8*f* and completely surrounded by a transparent light scattering material 34. When forwardly biased, LEDs 1*f*, 2*f*, and 3*f* emit light signals of red, green, and blue colors, respectively, which are blended by passing through light scattering material 34, acting to disperse the light signals, to form a composite light signal that emerges at the upper surface 35*f*. The color of the composite light signal may be controlled by varying the portions of red, green, and blue light signals. Display red LED 1*b*, green LED 2*b*, and blue LED 3*b* are similarly disposed in a display light blending cavity 8*b* and may be similarly activated.

In a similar fashion, background red LED 4*g*, green LED 5*g*, and blue LED 6*g* are disposed on support 10 in a background light blending cavity 9*g* and surrounded by transparent light scattering material 34. When forwardly biased, LEDs 4*g*, 5*g*, and 6*g* emit light signals of red, green, and blue colors, respectively, which are blended by passing through light scattering material 34 to form a composite light signal of a composite color that emerges at the upper surface 36*g*.

The display light blending cavities are optically separated from adjacent background light blending cavities by opaque walls. The display light blending cavity 8*f* is defined by walls 7*a* and 7*b* which have generally smooth inclined surfaces defining an obtuse angle with support 10. The walls 7*b* and 7*c* similarly define a background light blending cavity 9*g* therebetween. In a similar fashion, display light blending cavity 8*b* is defined by the 7*c* and 7*d*. The width of the top surfaces of the opaque walls is uniform and distinctly less than the width of the display areas or background regions so as to minimize the boundaries therebetween. The top surfaces of the opaque walls and top surfaces of the display areas and background regions are in the same plane to allow wide angle observation of the display device. Although the walls and light blending cavities are shown to be of certain shapes and dimensions, it is envisioned that they may be modified and rearranged.

Figure 10:
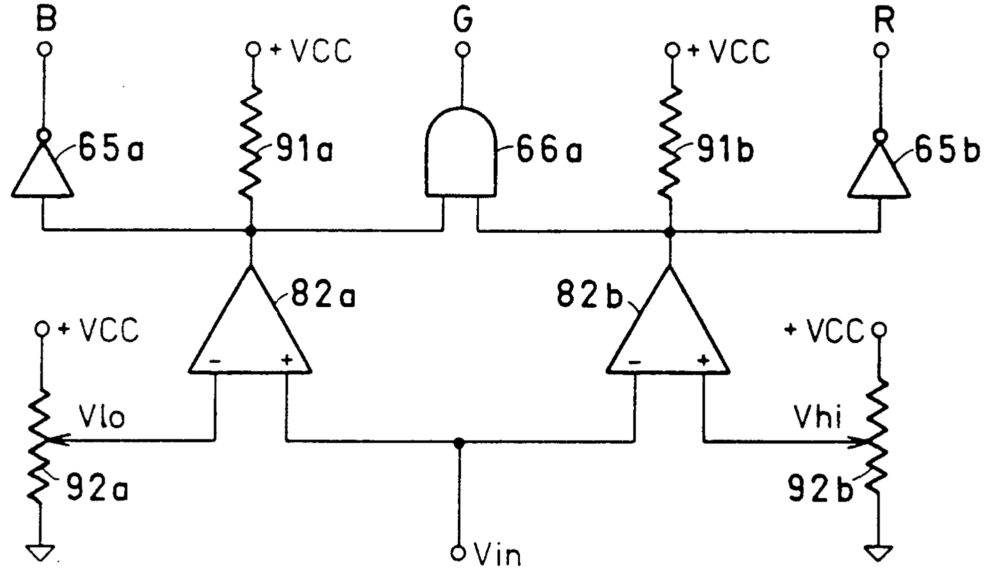
FIG. 10 is a schematic diagram of an analog comparator for developing color control signals.

In FIG. 10, the input signal Vin is applied to the interconnected inputs of two analog comparators 82*a*, 82*b* in a classic 'window' comparator configuration. When the input voltage is lower than the low voltage limit Vlo, set by a potentiometer 92*a*, the output of analog comparator 82*a* drops to a low logic level, thereby forcing the output of an inverter 65*a* to rise to a high logic level to develop active color control signal B.

When the input voltage is higher than the high voltage limit Vhi, set by a potentiometer 92*b*, the output of analog comparator 82*b* drops to a low logic level, thereby forcing the output of an inverter 65*b* to rise to a high logic level to develop active color control signal R.

When the input voltage is between the low voltage limit Vlo and the high voltage limit Vhi, the outputs of analog comparators 82*a*, 82*b* rise to a high logic level (pull-up resistors 91*a*, 91*b* ensure correct high and low levels), thereby causing the output of AND gate 66 to rise to a high logic level to develop active color control signal G.

The outputs B, G, and R may be respectively coupled to like inputs B, G, and R of the background buses in FIG. 4 for illuminating background area 32 in a color in accordance with the range in which the measured voltage lies. Alternatively, the outputs B, G, and R may be respectively coupled to like inputs B, G, and R of the display buses in FIG. 4 for illuminating display areas 31*a* to 31*f* of all display elements in display 41 in a color in accordance with the range in which the measured voltage lies.

Figure 11:
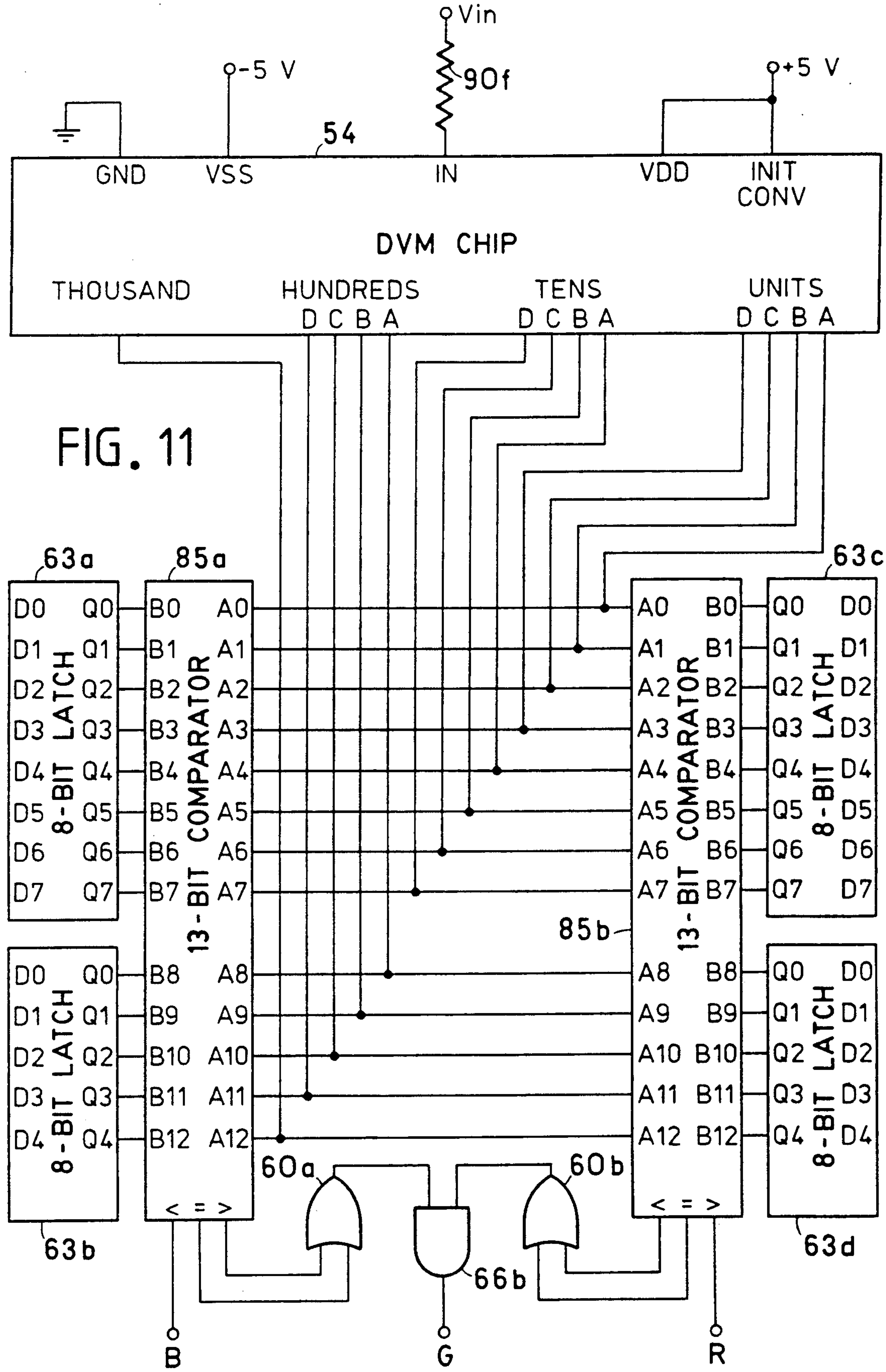
FIG. 11 is a schematic diagram of a digital comparator for developing color control signals.

In FIG. 11 is shown a schematic diagram of a digital voltmeter with a digital comparator for developing color control signals. A DVM chip 54 measures an input signal Vin applied via a resistor 90*f* to its input IN and develops at its outputs A, B, C, and D of Units, Tens, Hundreds, and Thousand digital data corresponding to the value of the measured input signal. The input INIT CONV (initiate conversion) is tied to a high logic level for causing DVM chip 54 to measure continuously. The output digital data are simultaneously applied to the inputs A0 to A12 of a 13-bit digital comparator 85*a* and to the inputs A0 to A12 of a like digital comparator 85*b*. Two 8-bit latches 63*a*, having its outputs Q0 to Q7 respectively coupled to the inputs B0 to B7 of digital comparator 85*a*, and 63*b*, having its outputs QO to Q4 respectively coupled to the inputs B8 to B12 of digital comparator 85*a*, are provided for storing a digital representation of a low limit. Two like latches 63*c*, having its outputs QO to Q7 respectively coupled to the inputs BO to B7 of digital comparator 85*b*, and 63*d*, having its outputs QO to Q4 respectively coupled to the inputs B8 to B12 of digital comparator 85*b*, are provided for storing a digital representation of a high limit. The digital comparator 85*a* compares the output digital data with the low limit and develops comparison signals accordingly. The digital comparator 85*b* compares the output digital data with the high limit and develops comparison signals accordingly. It would be obvious that measurement limits may be readily changed by clocking new data, representing new low limit and new high limit, into latches 63*a* to 63*d* (not shown).

When the output digital data of DVM chip 54 are less than the low limit, the output '<' of digital comparator 85*a* rises to a high logic level to generate an active color control signal B. When the output digital data are greater than the high limit, the output '>' of digital comparator 85*b* rises to a high logic level to generate an active color control signal R. When the output digital data are within the bounds of the low and high limits, one of the outputs '=' and '>' of digital comparator 85*a*, which are gated by an OR gate 60*a*, and one of the outputs '<' and '=' of digital comparator 85*b*, which are gated by an OR gate 60*b*, rise to a high logic level to force both inputs of an AND gate 66*b* to rise to a high logic level. As a consequence, the output of AND gate 66*b* rises to a high logic level to generate active color control signal G.

The comparison outputs B, G, and R may be respectively coupled to like inputs of the background buses in FIG. 4 for causing background area 32 of display 41 to illuminate either in blue color when the measured value is less than the low limit, in red color when the measured value is greater than the high limit, or in green color when the measured value is within the bounds of the low and high limits. Alternatively, the comparison outputs B, G, and R may be respectively coupled to like inputs B, G, and R of the display buses in FIG. 4 for causing display areas 31*a* to 31*f* of the display elements in display 41 to illuminate in a color in accordance with the relation of the measured value to the low limit and the high limit. It would be obvious that the color sequences could be readily changed by differently interconnecting the comparison outputs with the color control inputs.

Figure 12:
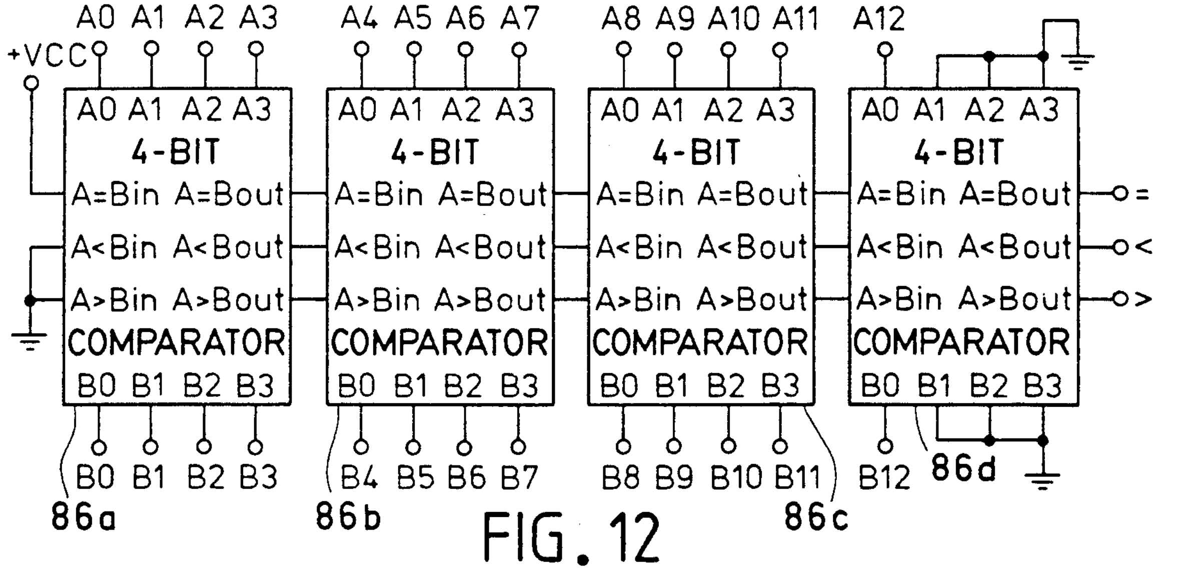
FIG. 12 is a detail of 13-bit digital comparator in FIG. 11.

FIG. 12 is a detail of one of 13-bit digital comparators 85*a*, 85*b* in FIG. 11. It will be appreciated that both digital comparators 85*a*, 85*b* may be substantially same. The comparison inputs '<', '=', and '>' of four 4-bit digital comparators 86*a*, 86*b*, 86*c*, and 86*d* are respectively coupled to like preceding outputs, in a manner well understood by those skilled in the art, to extend the comparison range to 13 bits.

The invention may be now briefly summarized. A measuring device was disclosed that comprises a device for measuring an input signal and a variable color display for indicating a measured value of the input signal in a character format. A comparator compares the measured value of the input signal with predetermined limits and develops comparison signals accordingly. Color control is provided for illuminating the display in a color in accordance with the comparison signals.

It would be obvious that that persons skilled in the art may resort to modifications in the construction of the preferred embodiments shown herein, without departing from the scope, as defined in the appended claims, and the spirit of the invention. It is contemplated that the principles of the invention may be also applied to numerous diverse types of display devices, such as liquid crystal devices, plasma devices, luminescent devices, cathode ray tube devices, and the like.

CORRELATION TABLE

This is a correlation table of reference characters, their descriptions, and examples of commercially available parts.

| # | DESCRIPTION | EXAMPLE |
|---|---|---|
| 1 | display red LED | |
| 2 | display green LED | |
| 3 | display blue LED | |
| 4 | background red LED | |
| 5 | background green LED | |
| 6 | background blue LED | |
| 7 | opaque wall | |
| 8 | display light blending cavity | |
| 9 | background light blending cavity | |
| 10 | support | |
| 11 | variable color display | |
| 12 | display red bus | |
| 13 | display green bus | |
| 14 | display blue bus | |
| 16 | background red bus | |
| 17 | background green bus | |
| 18 | background blue bus | |
| 21 | segment color control | |
| 22 | background color control | |
| 23 | display decoder | |
| 25 | non-inverting buffer | 74LS244 |
| 31 | display segment | |
| 32 | background area | |
| 34 | light scattering material | |
| 35 | top surface of display area | |
| 36 | top surface of background area | |
| 41 | 3½ digit variable color display | |
| 51 | A/D converter | |
| 53 | Teledyne DVM chip | TSC7107 |
| 54 | Teledyne DVM chip | TSC8750 |
| 60 | 2-input OR gate | 74HC32 |
| 63 | 8-bit latch | 74HC373 |
| 65 | inverter | 74HC04 |
| 66 | 2-input AND gate | 74HC08 |
| 81 | analog comparator | |
| 82 | analog comparator chip | LM339 |
| 84 | digital comparator | |
| 85 | 13-bit digital comparator | |
| 86 | 4-bit digital comparator | 74HC85 |
| 90 | resistor | |
| 91 | resistor | |
| 92 | potentiometer | |

CORRELATION TABLE-continued

This is a correlation table of reference characters, their descriptions, and examples of commercially available parts.

| # | DESCRIPTION | EXAMPLE |
|---|---|---|
| 93 | capacitor | |

What is claimed is:

1. A measuring device comprising:

means for measuring a signal and for developing output data indicative of the measured value of the signal;

variable color digital display means responsive to said output data for providing a digital indication of said measured value;

comparator means for comparing said measured value with a predetermined low limit and a predetermined high limit and for developing a first comparison signal when said measured value is lower than said low limit, a second comparison signal when said measured value is higher than said high limit, and a third comparison signal when said measured value lies within the bounds of said low limit and said high limit; and color control means for illuminating said digital indication in a first color in response to said first comparison signal, in a second color in response to said second comparison signal, and in a third color in response to said third comparison signal.

2. A measuring device comprising:

means for measuring a signal and for developing output data indicative of the measured value of the signal;

display means including a plurality of display areas responsive to said output data, for exhibiting an indication of said measured value, and an integral variable color background area substantially surrounding said display areas, said background area having a color control input for controlling its color;

comparator means for comparing said measured value with a predetermined low limit and a predetermined high limit and for developing a first comparison signal when said measured value is lower than said low limit, a second comparison signal when said measured value is higher than said high limit, and a third comparison signal when said measured value lies within the bounds of said low limit and said high limit; and color control means for activating the color control input of said background area for illuminating it in a first color in response to said first comparison signal, in a second color in response to said second comparison signal, and in a third color in response to said third comparison signal, whereby the color of said background area effectively indicates that it relates to the indication of said measured value exhibited on said display areas.

3. A measuring device comprising:

signal measuring means having an input for measuring an analog signal and an output for developing output data indicative of the measured value of the analog signal;

variable color digital display means responsive to said output data for providing a digital indication of said measured value;

an analog comparator having an input coupled to the input of said signal measuring means, for comparing the value of the analog signal with a predetermined low limit and a predetermined high limit, and having a first comparison output, for developing an active comparison signal when the value of the analog signal is lower than said low limit, a second comparison output, for developing an active comparison signal when the value of the analog signal is higher than said high limit, and a third comparison output, for developing an active comparison signal when the value of the analog signal lies within the bounds of said low limit and said high limit; and color control means having a first color control input, a second color control input, and a third color control input respectively coupled to said first comparison output, to said second comparison output, and to said third comparison output, and having a color control output coupled to said display means for illuminating said display means in a first color in response to the active comparison signal on said first comparison output, in a second color in response to the active comparison signal on said second comparison output, and in a third color in response to the active comparison signal on said third comparison output.

4. A measuring device comprising:

signal measuring means having an input for measuring a signal and an output for developing output digital data indicative of the measured value of the signal;

variable color digital display means responsive to said output digital data for providing a digital indication of said measured value;

a digital comparator having an input coupled to the output of said signal measuring means, for comparing the value of the output digital data with a predetermined low limit and a predetermined high limit, and having a first comparison output, for developing an active comparison signal when the value of the output digital data is lower than said low limit, a second comparison output, for developing an active comparison signal when the value of the output digital data is higher than said high limit, and a third comparison output, for developing an active comparison signal when the value of the output digital data lies within the bounds of said low limit and said high limit; and color control means having a first color control input, a second color control input, and a third color control input respectively coupled to said first comparison output, to said second comparison output, and to said third comparison output, and having a color control output coupled to said display means for illuminating said display means in a first color in response to the active comparison signal on said first comparison output, in a second color in response to the active comparison signal on said second comparison output, and in a third color in response to the active comparison signal on said third comparison output.

5. A measuring device comprising:

means for measuring a signal and for developing output signals indicative of the measured value of the signal;

display means including a variable color display area responsive to said output signals for providing a character indication of said measured value;

comparator means for comparing said measured value with a predetermined low limit and a predetermined high limit and for developing a first comparison signal when said measured value lies within the bounds of said low limit and said high limit, and for developing a second comparison signal when said measured value lies outside the bounds of said low limit and said high limit; and color control means for illuminating said display area in a first color in response to said first comparison signal, and for illuminating said display area in a second color in response to said second comparison signal.

6. A measuring device as claimed in claim 5 wherein said display means provide a digital indication of said measured value, and said color control input controls color of said digital indication.

7. A measuring device comprising:

means for measuring a signal and for developing output signals indicative of the measured value of the signal;

display means including a variable color display area responsive to said output signals for providing a character indication of said measured value, said display means having a color control input for controlling color of said display area; and comparator means having a comparator input and a comparator output, said comparator input being responsive to said output signals, for comparing said measured value with a predetermined limit, and for accordingly developing a comparison signal on said comparator output, said comparator output being coupled to said color control input for controlling color of said display area in accordance with a relation of said measured value to said limit.

8. A measuring device as claimed in claim 7 wherein said display means provide a digital indication of said measured value, and said color control input controls color of said digital indication.

9. A measuring device as claimed in claim 7 further comprising a memory for storing data representing said limit, whereby the value of said limit may be readily changed by storing different data in said memory.

10. A measuring device comprising:

means for measuring a signal and for developing output signals indicative of the measured value of the signal;

display means including a light emitting diode display area responsive to said output signals, for providing an indication of said measured value, and an integral variable color light emitting diode background area substantially surrounding said display area, said display means having a color control input for controlling color of said background area; and comparator means for comparing said measured value with a predetermined limit and for accordingly developing a comparison signal, said comparison signal being applied to said color control input for controlling color of said background area in accordance with a relation of said measured value to said limit.

11. A measuring device comprising:

means for measuring a signal and for developing output signals indicative of the measured value of the signal;

display means including a variable color light emitting diode display area responsive to said output signals, for providing a digital indication of said measured value, said display means having a color control input for controlling color of said digital indication; and comparator means for comparing said measured value with a predetermined limit and for accordingly developing a comparison signal, said comparison signal being applied to said color control input for controlling color of said digital indication in accordance with a relation of said measured value to said limit.

12. A measuring device comprising:

means for measuring a signal and for developing output signals indicative of the measured value of the signal;

display means including a variable color display area responsive to said output data for providing a character indication of said measured value, said display means having a color control input for controlling color of said display area;

a memory for storing data, said memory having a memory output indicative of the stored memory data; and a digital comparator having a first comparator input and a second comparator input, said first comparator input being responsive to said output data developed by said means for measuring, said second comparator input being responsive to said memory output, for comparing said measured value with said stored memory data and for accordingly developing a comparison signal, said comparison signal being applied to said color control input for controlling color of said display area in accordance with a relation of said measured value to said stored memory data.

13. A measuring device comprising:

means for measuring a signal and for developing output signals indicative of the measured value of the signal;

display means including a variable color display area responsive to said output signals for providing a digital indication of said measured value, said display means having a color control input for controlling color of said digital indication; and comparator means for comparing said measured value with a predetermined limit, said comparator means having a comparator output, said comparator output being coupled to said color control input, for developing a first comparison signal when said measured value is lower than said limit, for illuminating said digital indication i a first color, and for developing a second comparison signal when said measured value is higher than said limit, for illuminating said digital indication in a second color.

14. A measuring device comprising:

signal measuring means having an input for measuring a signal and an output for developing output signals indicative of the measured value of the signal;

display means including a variable color display area responsive to said output signals for providing a digital indication of said measured value, said display means having a first color control input for illuminating upon activation said digital indication in a first color, and said display means having a second color control input for illuminating upon activation said digital indication in a second color; and comparator means for comparing said measured value with a predetermined low limit and with a predetermined high limit, said comparator means having a first comparator output, for developing a first comparison signal when said measured value lies within the bounds of said low limit and said high limit, said first comparator output being coupled to said first color control input for illuminating said digital indication in a first color in response to said first comparison signal, and said comparator means having a second comparator output, for developing a second comparison signal when said measured value lies outside the bounds of said low limit and said high limit, said second comparator output being coupled to said second color control input for illuminating said digital indication in a second color in response to said second comparison signal.

15. A measuring device as claimed in claim 14 further comprising a memory for storing data representing said predetermined low limit and said predetermined high limit, whereby the values of said low limit and said high limit may be readily changed by storing different data in said memory.

* * * * *